United States Patent
Baek et al.

(10) Patent No.: US 9,509,329 B2
(45) Date of Patent: Nov. 29, 2016

(54) ASYNCHRONOUS SUCCESSIVE APPROXIMATION REGISTER ANALOG-TO-DIGITAL CONVERTER AND INTERNAL CLOCK GENERATOR INCLUDED THEREIN

(71) Applicant: Chung-Ang University Industry-Academy Cooperation Foundation, Seoul (KR)

(72) Inventors: Kwang Hyun Baek, Seoul (KR); Chang Woo Lee, Seoul (KR); Ju Eon Kim, Gyeonggi-do (KR)

(73) Assignee: Chung-Ang University Industry-Academy Cooperation Foundation, Seoul (KR)

( * ) Notice: Subject to any disclaimer, the term of this patent is extended or adjusted under 35 U.S.C. 154(b) by 0 days.

(21) Appl. No.: 15/140,963

(22) Filed: Apr. 28, 2016

(65) Prior Publication Data

US 2016/0241254 A1  Aug. 18, 2016

Related U.S. Application Data

(63) Continuation of application No. PCT/KR2014/012814, filed on Dec. 24, 2014.

(30) Foreign Application Priority Data

Jul. 31, 2014 (KR) .................. 10-2014-0098591

(51) Int. Cl.
*H03M 1/10* (2006.01)
*H03M 1/38* (2006.01)
(Continued)

(52) U.S. Cl.
CPC ............... *H03M 1/38* (2013.01); *H03K 5/134* (2014.07); *H03L 7/00* (2013.01); *H03M 1/125* (2013.01); *H03K 2005/00195* (2013.01)

(58) Field of Classification Search
CPC .. H03M 1/462; H03M 1/125; H03M 1/0612; H03M 1/0695; H03M 1/00; H03M 1/12; H03M 1/46; H03M 1/069; H03M 1/38; H03L 7/00; H03K 2005/00195
USPC .................................................. 341/118–155
See application file for complete search history.

(56) References Cited

U.S. PATENT DOCUMENTS 6,487,674 B1 * 11/2002 White .................... G06F 1/22
713/322
8,872,691 B1 * 10/2014 Stepanovic ............ H03M 1/06
341/144

(Continued)

FOREIGN PATENT DOCUMENTS

JP  2010-041098 A  2/2010
KR  2009-278500 A  11/2009

(Continued)

*Primary Examiner* — Lam T Mai
(74) *Attorney, Agent, or Firm* — Mintz Levin Cohn Ferris Glovsky and Popeo, P.C.; Kongsik Kim; Colleen H. Witherell (57) ABSTRACT

An asynchronous successive approximation register analog-to-digital converter and an internal clock generator included in the same are disclosed. The internal clock generator in an SAR ADC comprises a detection unit configured to generate an up pulse or a down pulse by sensing generation time of a final internal clock and next external clock; and a delay block configured to increase or decrease delay time by controlling a bias voltage according to the generated up pulse or the generated down pulse.

6 Claims, 7 Drawing Sheets

(51) Int. Cl.
  *H03K 5/134* (2014.01)
  *H03L 7/00* (2006.01)
  *H03M 1/12* (2006.01)
  *H03K 5/00* (2006.01)

(56) References Cited

U.S. PATENT DOCUMENTS

| | | | |
|---|---|---|---|
| 9,083,375 B1* | 7/2015 | Chang | H03M 1/125 |
| 9,350,375 B1* | 5/2016 | Lin | H03M 1/12 |
| 2013/0082855 A1* | 4/2013 | Kull | H03M 1/1215 |
| | | | 341/172 |
| 2013/0214947 A1* | 8/2013 | Yamamoto | H03M 1/38 |
| | | | 341/122 |
| 2014/0022105 A1* | 1/2014 | Chen | H03M 1/38 |
| | | | 341/161 |
| 2014/0184436 A1* | 7/2014 | Lee | H03M 1/1009 |
| | | | 341/161 |
| 2015/0042500 A1* | 2/2015 | Fujiwara | H03M 1/46 |
| | | | 341/155 |
| 2015/0280727 A1* | 10/2015 | Lien | H03M 1/1215 |
| | | | 341/118 |
| 2015/0280728 A1* | 10/2015 | Singh | H03M 1/462 |
| | | | 341/122 |
| 2015/0288376 A1* | 10/2015 | Gaalema | H03M 1/12 |
| | | | 341/172 |
| 2016/0056830 A1* | 2/2016 | Malik | H03M 1/462 |
| | | | 341/158 |

FOREIGN PATENT DOCUMENTS

| | | |
|---|---|---|
| KR | 2012-039475 A | 2/2012 |
| KR | 10-2013-0026627 A | 3/2013 |
| KR | 10-2014-0084577 A | 7/2014 |

* cited by examiner

FIG. 6D

ASYNCHRONOUS SUCCESSIVE APPROXIMATION REGISTER ANALOG-TO-DIGITAL CONVERTER AND INTERNAL CLOCK GENERATOR INCLUDED THEREIN

CROSS-REFERENCE(S) TO RELATED APPLICATION

This application is a continuation application of International Application No. PCT/KR2014/012814 filed on Dec. 24, 2014, which claims priority to Korean Application No. 10-2014-0098591 filed on Jul. 31, 2014, which applications are hereby incorporated by reference.

TECHNICAL FIELD

The present disclosure relates to an asynchronous successive approximation register analog-to-digital converter in which an internal clock can keep stable operation irrespective of change of a temperature and a corner.

BACKGROUND ART

An asynchronous successive approximation register analog-to-digital converter SAR ADC with small size and low power has been more required according as usage of a low power application such as a mobile device has been increased.

The asynchronous SAR ADC has rapid conversion velocity by generating desired number of internal clocks corresponding to one external clock. However, the asynchronous SAR ADC has a demerit in that a delay time by a delay block for assuring stability time of a capacitor digital-to-analog converter CDAC changes passively according to variation of a corner and a temperature. That is, in the asynchronous SAR ADC, the delay time generated by the delay block is passively changed according to the variation of the corner and the temperature, and so stability error of the capacitor DAC in the SAR ADC may occur and every bit may not be converted in one external clock.

SUMMARY

The present invention is to provide an asynchronous successive approximation register analog-to-digital converter where an internal clock may keep stable operation irrespective of change of a corner and change of temperature of whole or partial of a circuit.

An internal clock generator in an SAR ADC according to one embodiment of the present invention includes a detection unit configured to generate an up pulse or a down pulse by sensing generation time of a final internal clock and next external clock; and a delay block configured to increase or decrease delay time by controlling a bias voltage according to the generated up pulse or the generated down pulse.

The detection unit generates the down pulse in the event that the final internal clock is sensed earlier than the next external clock, and generates the up pulse in the event that the next external clock is sensed earlier than the final internal clock.

The delay block decreases the delay time by increasing the bias voltage according to the up pulse, and increases the delay time by decreasing the bias voltage according to the down pulse.

The delay block includes: a delay controller configured to increase or decrease the bias voltage according to the up pulse or the down pulse; and an inverter chain configured to increase or decrease the delay time according to increasing or decreasing of the bias voltage.

The internal clock generator further comprises a driving signal generator configured to generate a driving signal for driving the delay block and output the generated driving signal.

The internal clock generator further comprises a flip-flop array configured to generate sequentially n internal clocks according to the driving signal.

A successive approximation register analog-to-digital converter according to another embodiment of the present invention includes a comparator; and an internal clock generator configured to generate n internal clock according to an output signal of the comparator. Here, the internal clock generator controls a bias voltage by sensing generation time of a final internal clock and next external clock, thereby increasing or decreasing delay time for operation of the comparator.

The present invention provides an asynchronous successive approximation register analog-to-digital converter in which an internal clock may keep stable operation irrespective of change of temperature and a corner.

BRIEF DESCRIPTION OF DRAWINGS

Example embodiments of the present invention will become more apparent by describing in detail example embodiments of the present invention with reference to the accompanying drawings, in which.

DETAILED DESCRIPTION

The invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

In the present specification, an expression used in the singular encompasses the expression of the plural, unless it has a clearly different meaning in the context. In the present specification, terms such as "comprising" or "including," etc., should not be interpreted as meaning that all of the elements or operations are necessarily included. That is, some of the elements or operations may not be included, while other additional elements or operations may be further included. Also, terms such as "unit," "module," etc., as used in the present specification may refer to a part for processing at least one function or action and may be implemented as hardware, software, or a combination of hardware and software.

Hereinafter, embodiments of the invention will be described in detail with reference to accompanying drawings.

Figure 1:
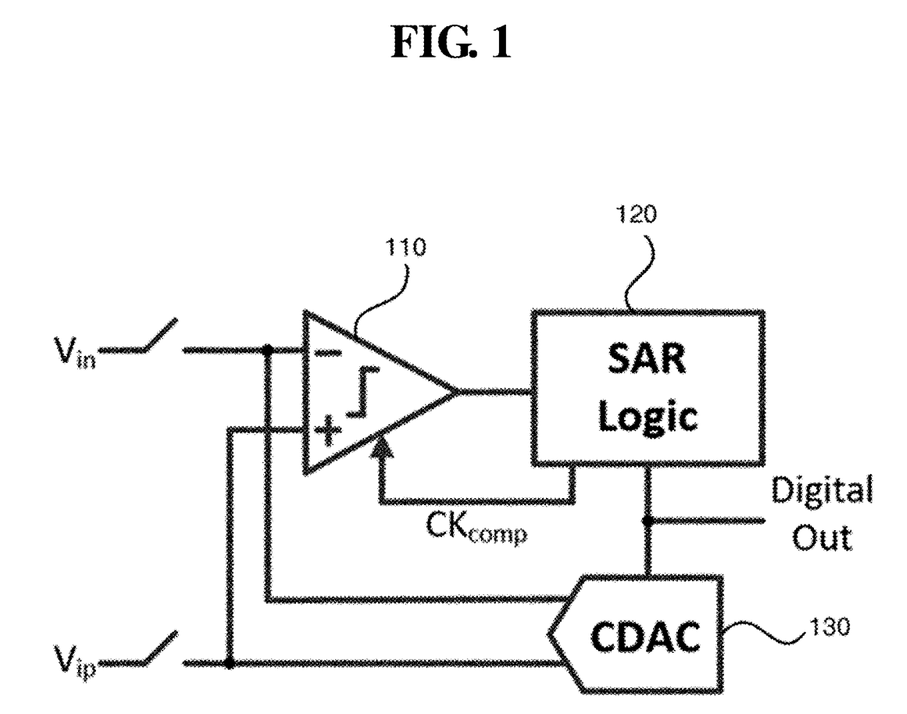
FIG. 1 is a view illustrating schematically a circuit of conventional SAR ADC.

FIG. 1 is a view illustrating schematically a circuit of conventional SAR ADC.

In FIG. 1, the conventional SAR ADC includes a comparator 110, a successive approximation register logic 120 (hereinafter, referred to as "SAR logic") and a capacitor digital-to-analog converter 130 (hereinafter, referred to as "CDAC").

In the asynchronous SAR ADC 100 shown in FIG. 1, analog-digital conversion is performed by inputting output of the comparator 110 to the CDAC 130 through the SAR logic 120.

Analog-digital conversion progressed in sequence is synchronized by external clock in a synchronous SAR ADC, but analog-digital conversion is performed by internal logic in the asynchronous SAR ADC.

The comparator 110 receives output of the CDAC 130, discriminates whether or not the received output is higher or less than predetermined value, e.g. 0, and outputs the discrimination result to the SAR logic 120.

A time for stabilizing adequately an analog voltage of the CDAC 130 is required for the purpose of accurate comparison of the comparator 110. Generally, the asynchronous SAR ADC realizes the requirement by using a delay block.

A delay block is generally realized with a long channel inverter chain, or may include further a capacitor between inverters of an inverter chain. The delay block should be designed so that the analog-digital conversion can be performed even in worst case considering preset temperature range and a corner. However, the problem exists in that delay time by conventional delay block varies passively according as temperature and a corner change. As a result, the delay time at specific temperature and corner may be excessively shorter, and thus a stability time of the CDAC 130 is not assured and performance of total circuit may be deteriorated.

The SAR logic 120 outputs a digital signal having n bit by performing a successive approximation operation. Additionally, the SAR logic 120 receives an output of the comparator 110 and outputs the received output to the CDAC 130.

Figure 2:
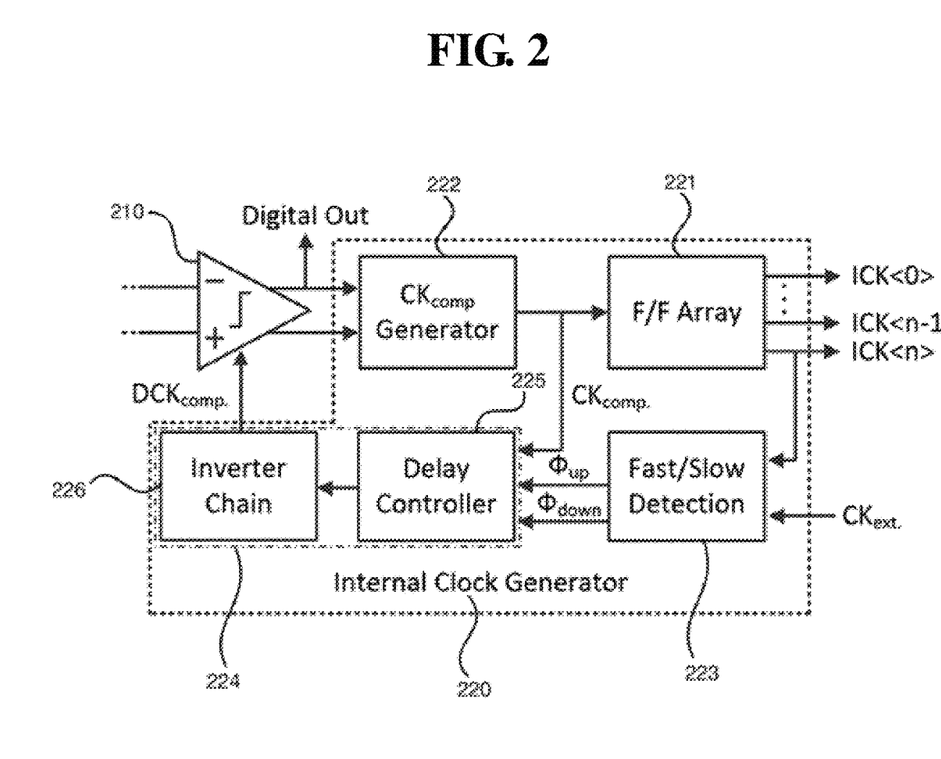
FIG. 2 is a block diagram illustrating internal circuit of asynchronous SAR ADC according to one embodiment of the invention.
Figure 3:
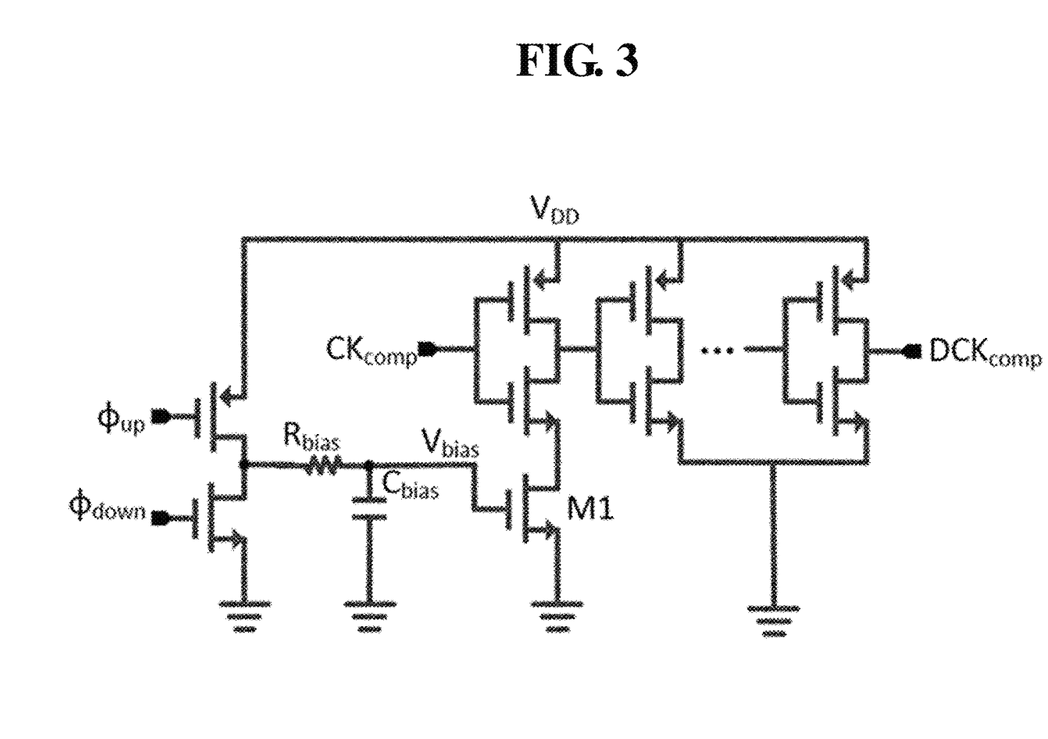
FIG. 3 is a view illustrating schematically a delay block according to one embodiment of the invention.
Figure 4:
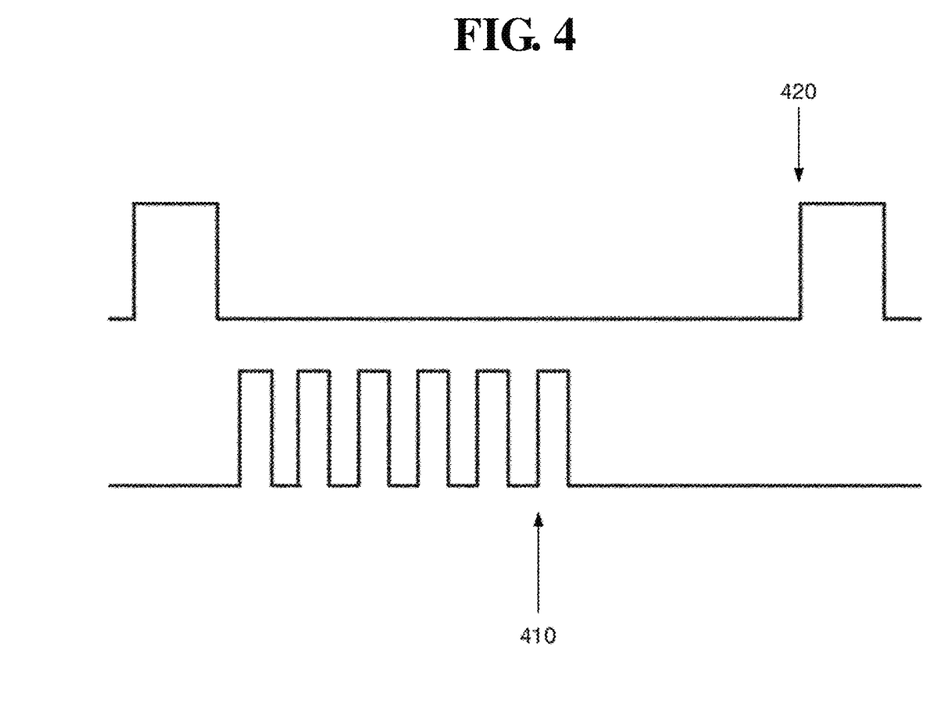
FIG. 4 and FIG. 5 are views for describing generation time of a final internal clock and an external clock.
Figure 5:
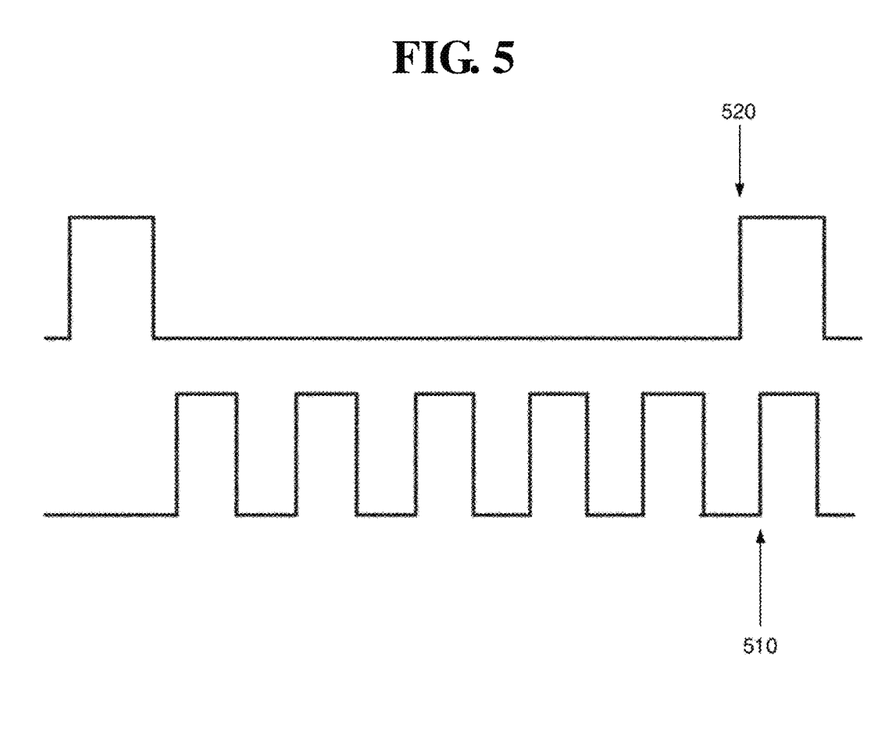

FIG. 2 is a block diagram illustrating internal circuit of asynchronous SAR ADC according to one embodiment of the invention, FIG. 3 is a view illustrating schematically a delay block according to one embodiment of the invention, and FIG. 4 and FIG. 5 are views for describing generation time of a final internal clock and an external clock.

In FIG. 2, the asynchronous SAR ADC 200 of the present embodiment includes a comparator 210 and an internal clock generator 220.

The comparator 210 receives output of the internal clock generator 220 and operates according to the output of the internal clock generator 220. The comparator 210 discriminates whether or not the output of the internal clock generator 220 is higher or smaller than predetermined value, e.g. 0, and outputs the discrimination result to the internal clock generator 220.

The internal clock generator 220 generates n internal clock signals by using one external clock signal.

The internal clock generator 220 includes a flip-flop array 221, a driving signal generator 222, a detection unit 223 and a delay block 224 as shown in FIG. 2.

The flip-flop array 221 outputs n internal clock signals needed for driving the CDAC by operating according to a driving signal CKcomp inputted through the driving signal generator 222. The flip-flop array 221 may output sequentially the internal clock signals through respective flip-flops according to the driving signal CKcomp, wherein one flip-flop outputs one internal clock signal.

As a result, the flip-flop array 221 may generate sequentially internal clocks ICKs for driving in sequence n capacitors of the CDAC by operating according to the driving signal CKcomp inputted through the driving signal generator 222, and the CDAC is synchronized with the internal clock ICK and may perform sequentially the conversion using the discrimination result inputted through the comparator 210.

Hereinafter, it is assumed for convenience of description that a signal outputted first is referred to as a first internal clock signal and a signal outputted finally is referred to as an nth internal clock signal, in FIG. 2. Each of the internal clock signals may be outputted with one cycle interval.

A final internal clock signal, i.e. the nth internal clock signal outputted through the flip-flop array 221 may be outputted to the detection unit 223.

The detection unit 223 determines increasing or decreasing of delay time by using the final internal clock signal, i.e. the nth internal clock signal inputted through the flip-flop array 221 and next external clock signal.

That is, the detection unit 223 may sense whether the nth internal clock signal inputted through the flip-flop array 221 is generated earlier than the next external clock signal, and determine increasing or decreasing of the delay time depending on the sensing result.

For example, the detection unit 223 outputs a down pulse to the delay block 224 in the event that the final internal clock signal, i.e. the nth internal clock signal is sensed earlier than the next external clock signal.

However, the detection unit 223 may output an up pulse to the delay block 224 in the event that the next external clock signal is sensed earlier than the final internal clock signal, i.e. the nth internal clock signal generated by the flip-flop array 221.

The driving signal generator 222 generates the driving signal and outputs the generated driving signal to the flip-flop array 221 and the delay block 224.

The delay block 224 performs increasing or decreasing of the delay time by operating according to the driving signal inputted by the driving signal generator 222.

The delay block 224 includes a delay controller 225 and an inverter chain 226 as shown in FIG. 2.

Schematic plan of the delay block 224 is shown in FIG. 3.

In FIG. 3, the delay controller 225 includes a transistor M1 for adjusting a bias voltage to the inverter chain 226 and circuits for controlling the bias voltage.

For example, in the event that a final internal clock 410 (nth internal clock) is generated (sensed) earlier than next external clock 420 as shown in FIG. 4, the detection unit 223 outputs the down pulse to the delay controller 225 of the delay block 224.

Accordingly, the delay controller 225 discharges a capacitor Cbias according to the down pulse inputted through the detection unit 223 and decreases a bias voltage Vbias. As a result, the delay block 224 increases the delay time and outputs the increased delay time to the comparator 210.

However, in the event that next external clock 520 is generated (sensed) earlier than a final internal clock 510 (nth internal clock) as shown in FIG. 5, the detection unit 223 outputs the up pulse to the delay controller 225.

Accordingly, the delay controller 225 charges the capacitor Cbias according to the up pulse inputted through the detection unit 223 and increases the bias voltage Vbias. As a result, the delay block 224 decreases the delay time and outputs the decreased delay time to the comparator 210.

As described above, the asynchronous SAR ADC of the present embodiment adjusts again the bias voltage Vbias whenever new analog input is sampled by synchronizing the up pulse or the down pulse according to the external clock, thereby optimizing the delay time.

FIGS. 6A to 6D illustrate simulation result of the conventional SAR ADC and the SAR ADC of the present invention.

Figure 6A:
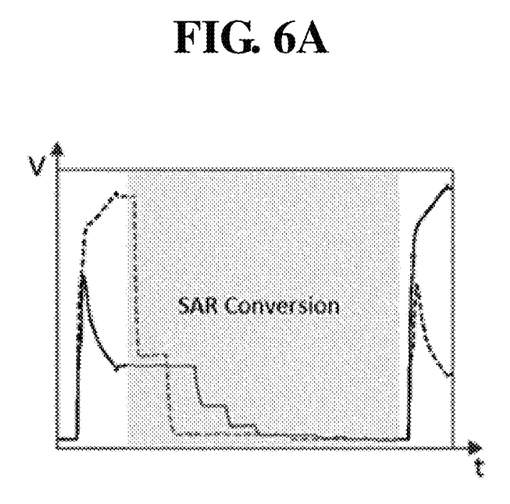
FIG. 6A to 6D are views illustrating simulation result of the conventional SAR ADC and the SAR ADC of the present invention.
Figure 6B:
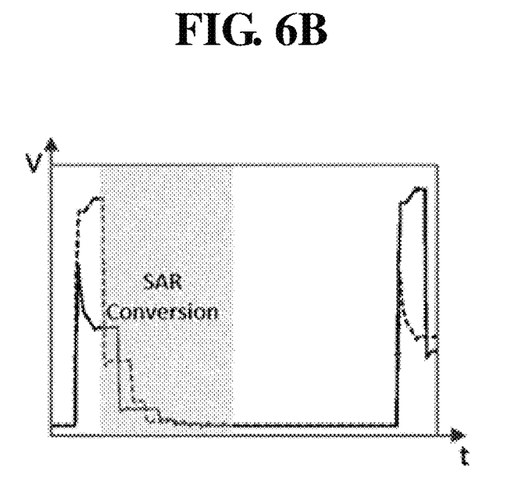
Figure 6C:
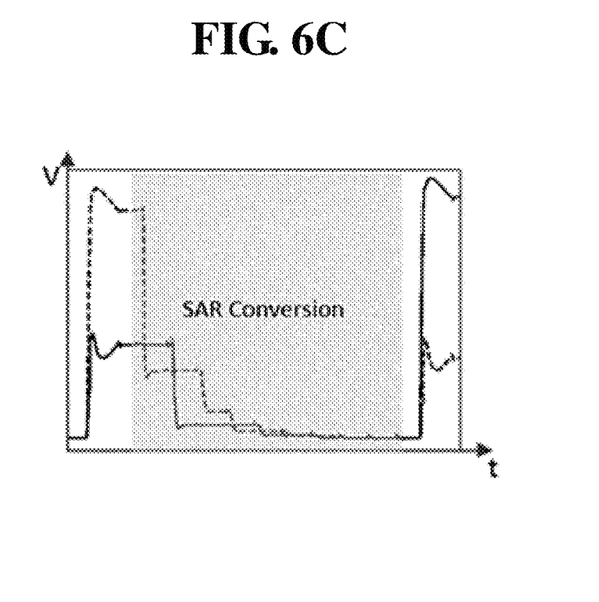

FIG. 6A shows simulation result of the conventional SAR ADC at 125° C. and SS corner, and FIG. 6B illustrates simulation result of the convention SAR ADC at −40° C. and FF corner. FIG. 6C shows simulation result of the SAR ADC of the present invention at 125° C. and SS corner, and FIG. 6D illustrates simulation result of the SAR ADC at −40° C. and FF corner.

It is verified by FIGS. 6A and 6B that an internal clock responds sensitively at change of temperature and a corner in the conventional SAR ADC, and thus change width of conversion time of the SAR ADC is great.

Figure 6D:
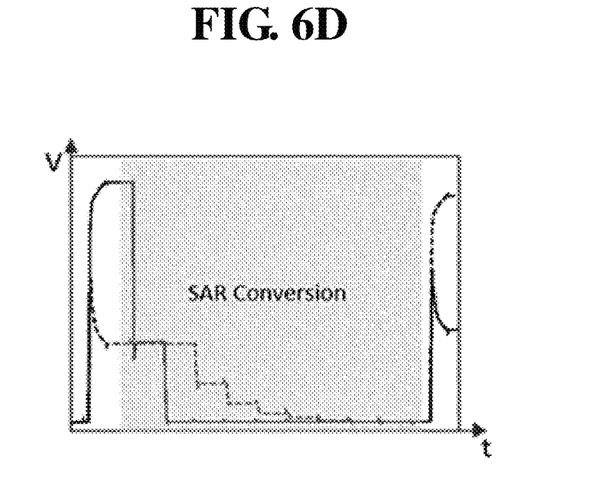

Whereas, it is verified by FIGS. 6C and 6D that the SAR ADC of the present invention generates internal clocks which are stable under wide temperature range and corner condition and divided properly in a period, thereby assuring adequate stability time in conversion of the SAR ADC.

The embodiments of the invention described above are disclosed only for illustrative purposes. A person having ordinary skill in the art would be able to make various modifications, alterations, and additions without departing from the spirit and scope of the invention, but it is to be appreciated that such modifications, alterations, and additions are encompassed by the scope of claims set forth below.

The present invention may be applied to various electronic devices.

The invention claimed is:

1. An internal clock generator in an SAR ADC comprising:
   a detection unit configured to generate an up pulse or a down pulse by sensing generation time of a final internal clock and next external clock; and
   a delay block configured to increase or decrease delay time by controlling a bias voltage according to the generated up pulse or the generated down pulse,
   wherein the delay block includes:
   a delay controller configured to increase or decrease the bias voltage according to the up pulse or the down pulse; and
   an inverter chain configured to increase or decrease the delay time according to increasing or decreasing of the bias voltage.

2. The internal clock generator of claim 1, wherein the detection unit generates the down pulse in the event that the final internal clock is sensed earlier than the next external clock, and generates the up pulse in the event that the next external clock is sensed earlier than the final internal clock.

3. The internal clock generator of claim 1, wherein the delay block decreases the delay time by increasing the bias voltage according to the up pulse, and increases the delay time by decreasing the bias voltage according to the down pulse.

4. The internal clock generator of claim 1, further comprising:
   a driving signal generator configured to generate a driving signal for driving the delay block and output the generated driving signal.

5. The internal clock generator of claim 4, further comprising:
   a flip-flop array configured to generate sequentially n internal clocks according to the driving signal.

6. A successive approximation register analog-to-digital converter comprising:
   a comparator; and
   an internal clock generator configured to generate n internal clock according to an output signal of the comparator,
   wherein the internal clock generator includes:
   a detection unit configured to generate an up pulse or a down pulse by sensing generation time of a final internal clock and next external clock; and
   a delay block configured to increase or decrease delay time by controlling a bias voltage according to the generated up pulse or the generated down pulse,
   wherein the delay block includes:
   a delay controller configured to increase or decrease the bias voltage according to the up pulse or the down pulse; and
   an inverter chain configured to increase or decrease the delay time according to increasing or decreasing of the bias voltage.

* * * * *